(12) United States Patent
Rey et al.

(10) Patent No.: US 8,163,586 B2
(45) Date of Patent: Apr. 24, 2012

(54) METHOD OF PRODUCING A SUSPENDED MEMBRANE DEVICE

(75) Inventors: Patrice Rey, La Manche (FR); Mouna Salhi, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 432 days.

(21) Appl. No.: 12/265,256

(22) Filed: Nov. 5, 2008

(65) Prior Publication Data

US 2009/0124035 A1    May 14, 2009

(30) Foreign Application Priority Data

Nov. 9, 2007 (FR) .................................. 07 58915

(51) Int. Cl.
*H01L 21/00* (2006.01)
(52) U.S. Cl. .................. 438/53; 438/411; 257/E21.54; 257/E21.573; 216/17
(58) Field of Classification Search .............. 438/53, 438/411; 257/E21.54, E21.573; 216/17, 216/39, 51
See application file for complete search history.

(56) References Cited

U.S. PATENT DOCUMENTS

| | | | |
|---|---|---|---|
| 5,466,630 A | 11/1995 | Lur | |
| 5,510,276 A | 4/1996 | Diem et al. | |
| 5,512,499 A | 4/1996 | Cambou et al. | |
| 5,798,283 A * | 8/1998 | Montague et al. | 438/24 |
| 6,250,165 B1 | 6/2001 | Sakai et al. | |
| 2002/0117728 A1 * | 8/2002 | Brosnihan et al. | 257/446 |
| 2003/0213433 A1 * | 11/2003 | Choate et al. | 118/723 VE |
| 2004/0048410 A1 * | 3/2004 | O'Brien et al. | 438/52 |
| 2004/0119125 A1 | 6/2004 | Gogoi et al. | |
| 2005/0230708 A1 * | 10/2005 | Reichenbach et al. | 257/200 |
| 2006/0240640 A1 * | 10/2006 | Nesterenko et al. | 438/455 |
| 2007/0048888 A1 * | 3/2007 | Christenson | 438/48 |

FOREIGN PATENT DOCUMENTS

| | | |
|---|---|---|
| DE | 199 03 380 A1 | 8/1999 |
| DE | 101 44 847 A1 | 3/2003 |
| KR | 2004-0102390 A | 12/2004 |

OTHER PUBLICATIONS

French Search Report.

* cited by examiner

*Primary Examiner* — Caridad M Everhart
(74) *Attorney, Agent, or Firm* — Pearne & Gordon LLP

(57) ABSTRACT

A method for producing a device with at least one suspended membrane, including the following steps: Producing a trench through a first sacrificial layer and a second layer deposited on the first sacrificial layer, the trench completely surrounding at least a portion of the first sacrificial layer and at least a portion of the second layer, filling all or a portion of the trench with at least one material capable of resisting at least one etching agent, and etching the portion of the first sacrificial layer with the etching agent through at least one opening made in the second layer, the portion of the second layer forming at least one portion of the suspended membrane.

11 Claims, 17 Drawing Sheets

METHOD OF PRODUCING A SUSPENDED MEMBRANE DEVICE

TECHNICAL FIELD

This document relates to the field of MEMS (microelectromechanical systems) or NEMS (nanoelectromechanical systems) and, in particular, that of microsensors comprising surface technology-produced suspended elements.

PRIOR ART

Several methods currently exist which enable production of MEMS comprising suspended portions of material called suspended membranes.

The document US 2004/0119125 describes a method of producing a surface MEMS structure from an SOI (silicon on insulator) substrate. Several openings are made through the silicon upper layer and the dielectric layer of the SOI substrate. An insulating and etch-resistant material is deposited in these openings, and then a silicon layer is grown epitaxially on the upper layer of silicon of the SOI substrate. The dielectric layer is then etched, thereby causing the epitaxially grown layer to rest on anchoring studs formed by the insulating material and connected to the lower layer of silicon of the SOI substrate.

However, it is sometimes necessary to produce membranes which do not comprise anchoring studs distributed thereunder.

The document U.S. Pat. No. 5,510,276 describes a method of producing a surface pressure sensor. This sensor is made from an SOI substrate. An opening is made through the upper layer of silicon of the SOI substrate until reaching the insulating layer. The insulating layer is then etched with a hydrofluoric acid-based solution diffused through the previously made opening. This etching is propagated concentrically beneath the upper layer of silicon. This etching is stopped when the desired etched oxide diameter is attained.

This method enables suspended structures to be formed, i.e., suspended, circular membranes the anchoring of which is produced by a peripheral wall of oxide situated beneath the silicon suspended portion.

In particular, this method has the disadvantage of using time as a dimensional control parameter for the suspended structure produced. Such being the case, and given that the etch rate depends on the pH of the etching agent and that, for a single etching agent, this rate depends on the temperature and composition of the etched dielectric, this method does not make it possible to obtain a precise characterisation of the dimensions of the structure produced.

Furthermore, with this method, the opening through which the etching solution is diffused is necessarily arranged at the centre of the suspended membrane. The plug then used to close the opening contains a different material from that of the membrane, and can therefore be considered as a defect capable of altering the mechanical properties of the membrane. In particular, in the case where this membrane is a vibrating element of a microphone or ultrasonic transducer, the plug can induce perturbations in the wave transmitted. Finally, the shape of the suspended membrane obtained by this method is necessarily circular.

DISCLOSURE OF THE INVENTION

Thus there is a need to propose a new method of producing a suspended membrane, which eliminates or reduces the disadvantages of the methods of the prior art, i.e., which offers improved precision in the production of the suspended membrane, e.g., with respect to the dimensions and shape of the membrane produced, thereby making it possible to obtain suspended membranes of any shape, limiting degradation of the mechanical properties of this membrane due to the production method, and improving the attachments of the structure produced.

To accomplish this, one embodiment proposes a method for producing a device with at least one suspended membrane, comprising at least the following steps:

producing a trench through a first sacrificial layer and a second layer deposited on the first sacrificial layer, the trench completely surrounding at least a portion of the first sacrificial layer and at least a portion of the second layer, filling all or a portion of the trench with at least one material capable of resisting at least one etching agent, etching said portion of the first sacrificial layer with said etching agent through at least one opening made in the second layer, said portion of the second layer forming at least one portion of the suspended membrane.

In this method, the trench thus has a closed-contour pattern enabling the production of an etch stop wall of the sacrificial layer, which, for example, is the oxide layer of an SOI-type substrate. The trench filled with an etch stop material thus forms this wall, geographically defining an enclosed area of the sacrificial layer surrounded by this wall. Since the wall material deposited in the trench is resistant to the etching agent of the sacrificial layer, this wall acts as an etch stop wall.

In this way, suspended membranes made of a monocrystalline material can be produced, from which it is possible to build suspended structures. Furthermore, this method enables suspended membranes to be produced of which the characteristics such as shape or desired dimensions can be more precise than with the methods of the prior art.

This method does not impose any constraint on the shape of the suspended membrane.

This method likewise permits free positioning of access holes to the sacrificial layer. These will preferably be situated in areas which do not modify the mechanical properties of the structure (e.g., for pressure sensors, on the edge of the membrane). In this way, degradation of the mechanical properties of the suspended membrane due to these access holes is limited.

The second layer may comprise at least one semiconductor material at least a portion of which is monocrystalline.

Prior to the trench production step, the method may further comprise, a step of producing at least one electrode beneath said portions of the first sacrificial layer and second layer, via ion implantation in a third layer, the first sacrificial layer and second layer being capable of being deposited on this third layer.

According to an alternative, prior to the trench production step, the method may further comprise a step of producing at least one electrode via at least one deposit of an electrically conductive material capable of resisting at least said etching agent, e.g., polysilicon, on a third layer containing a material capable of resisting at least said etching agent, the first sacrificial layer and second layer being capable of being deposited on the third layer, said portion of the first sacrificial layer being capable of being deposited over at least a portion of the electrode.

The production of this electrode enables the manufacture of sensors or capacitive actuators, the sensing or actuating capability of which is produced by this electrode and the suspended membrane.

The material deposited in the trench may be a dielectric material. In this way, the layers produced above the sacrificial layer may be electrically insulated from the layers situated beneath the sacrificial layer.

The material capable of resisting at least said etching agent may be an electrically conductive material. In this case, the anchoring wall or walls ensure an electrical connection between the layers situated above the sacrificial layer and the layers situated beneath the sacrificial layer.

Between the step of filling the trench and the step of etching said portion of the first sacrificial layer, the method may further comprise a step of non-selective epitaxy on the second layer and on the material deposited in the trench. In this way, the thickness of the surface layer intended to form the suspended membrane is increased.

In an alternative embodiment, between the step of filling the trench and the step of etching said portion of the first sacrificial layer, the method may further include, a step of transferring a material onto the second layer and onto the material capable of resisting at least said etching agent deposited in the trench, and possibly a step of thinning out the transferred material.

The transferred material may in particular be at least partially monocrystalline, thereby making it possible to obtain a monocrystalline anchoring of the suspended membrane. In this way, the quality of the anchoring produced is improved, owing to better mechanical properties than those obtained with a polycrystalline material.

Filling of the trench may be obtained via deposition.

In an alternative, filling of the trench may be obtained via a step of non-selective epitaxy on the second layer and in the trench.

After the etching step, the method may further comprise a step of depositing a passivation layer onto the device.

Finally, after the etching step, the method may further comprise a step of producing contacts which are electrically connected to said portion of the second layer, and/or to the electrode when the method comprises a step for producing an electrode.

Filling of the trench may be obtained by at least a first deposit of a material resistant to said etching agent and by a second deposit of another material into the trench.

The trench may be filled by a first deposit of a dielectric material and by a second deposit of said material resistant to said etching agent. When the material resistant to said etching agent is electrically conductive, this alternative makes it possible, in particular, to electrically insulate the anchoring of the remainder of the substrate by means of the first dielectric deposit.

It is thus possible to optimize the filling of the trench, in particular when the latter is wide, or according to the intended function to be performed by the anchoring wall (support and/or conduction of electrical signals). Therefore, several different materials may be arranged in the trench.

BRIEF DESCRIPTION OF THE DRAWINGS

This invention will be better understood upon reading the description of exemplary embodiments provided for purely illustrative and non-limiting purposes, with reference to the appended drawings, in which.

So as to facilitate moving from one figure to another, identical, similar or equivalent portions of the various figures described hereinbelow carry the same numerical references.

The various portions shown in the figures are not necessarily at a uniform scale, in order to make the figures more legible.

The various possibilities (alternatives and embodiments) should be understood as being non-exclusive of one another and capable of being combined together.

DETAILED DISCLOSURE OF PARTICULAR EMBODIMENTS

Reference is first made to FIGS. 1 to 7, which show the steps of a method for producing a suspended membrane device 100 according to a first embodiment.

The device 100 is produced from semiconductor-based substrate 102 such as silicon, upon which are stacked a dielectric layer 104, e.g., containing $SiO_2$ and forming a sacrificial layer having a thickness equal to approximately 1 μm, or more generally between approximately 0.1 μm and 3 μm, and a thin layer 106 containing a semiconductor material, e.g., monocrystalline silicon. In an alternative, layer 106 may contain a semiconductor material other than silicon, e.g., such as SiC (silicon carbide) or a piezoelectric material such as $LiNbO_3$ (lithium niobate) or $BaTiO_3$ (barium titanate). In this case, the semiconductor layer 106 has a thickness of less than approximately 10 μm, or of between approximately 0.1 μm and several tens of micrometres, or less than approximately 100 μm. In this first embodiment, the substrate 102, the sacrificial layer 104 and the semiconductor layer 106 form an advantageously monocrystalline SOI substrate.

Figure 1:
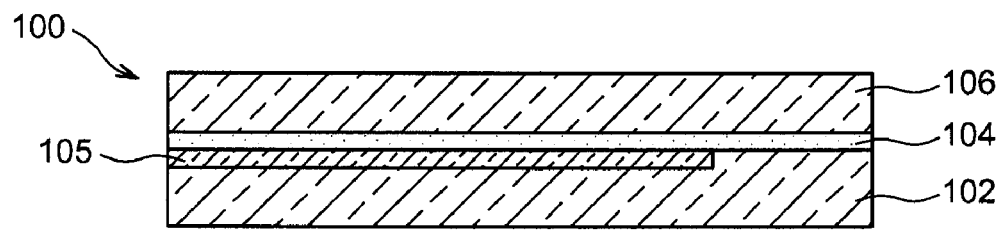
FIGS. 1 to 7 show the steps of a method for producing a suspended membrane device according to a first embodiment.

As shown in FIG. 1, it is possible to carry out ion implantation of type P or N dopants depending on whether the substrate 102 is of type N or P, respectively, thereby forming a doped region 105 in the substrate 102. Together with the remainder of the substrate 102, this doped silicon region 105 forms a PN junction. For example, in the case of implantation of boron through an $SiO_2$-based sacrificial layer 104 having a thickness equal to approximately 230 nm and a silicon-based semiconductor layer 106 having a thickness equal to approximately 120 nm, the thickness of the doped region 105 is, for example, equal to approximately 0.3 μm. This implantation, for example, is carried out with ion beams having a degree of energy equal to approximately 100 keV, the implanted dose being equal to approximately $3.10^{15}$ atoms/cm². Generally speaking, the thickness of the semiconductor layer 106 and that of the sacrificial layer 104, for example, may be sufficiently small to enable ion implantation through these layers.

This ion implantation may be used to produce electrodes embedded in the substrate 102, e.g., capable of being used to produce capacitive sensing or actuation between one or more of these embedded electrodes, which are situated beneath the suspended membrane of the device, and said suspended membrane.

Figure 2:
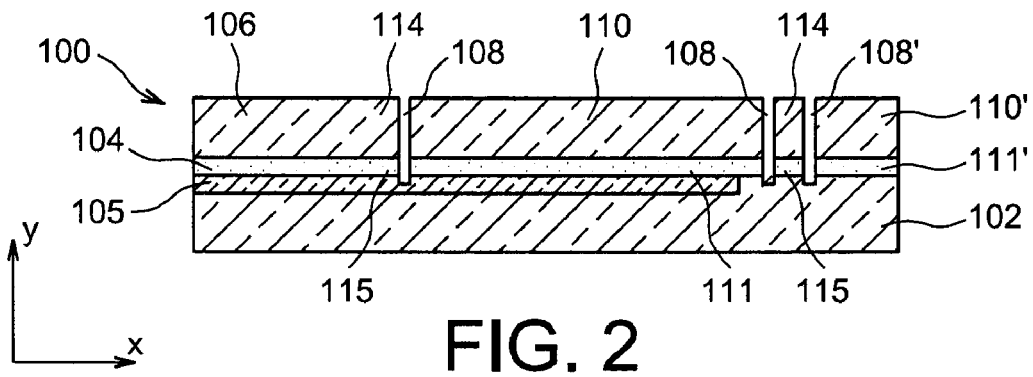
Figure 3:
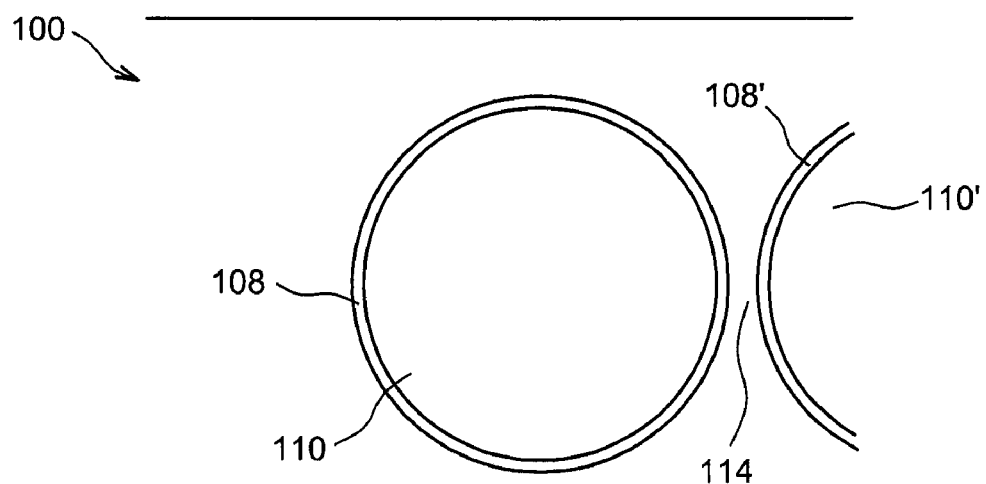

As shown in FIG. 2, etching is then carried out in the semiconductor layer 106 and sacrificial layer 104, thereby forming a trench 108. The trench 108 passes through the semiconductor layer 106 and the sacrificial layer 104 completely. This trench 108 may likewise be partially formed in the substrate 102. In FIG. 3 (top view of the device 100), it is seen that the trench 108 is made along a continuous line, completely surrounding and defining a portion 110 of the semiconductor layer 106, intended to form at least a portion of the suspended membrane of the device 100. To illustrate, a second trench 108' defining a second portion 110' of the semiconductor layer 106, intended to form a second suspended membrane of the device 100, is shown partially in FIGS. 2 and 3. The trench 108 likewise completely surrounds a portion 111 of the sacrificial layer 104 situated beneath portion 110 of the semiconductor layer 106. In the same way, trench 108' defines a portion 111' of the sacrificial layer 104 situated beneath portion 110' of the semiconductor layer 106. The doped region 105 is situated at least partially beneath portion 110 of the semiconductor layer 106. Trench 108, for example, has a width (dimension along the x-axis shown in FIG. 2) of between approximately 1 μm and 2 μm.

The pattern formed by the trench 108 may be different from a circle, e.g., rectangular, hexagonal, or of any other shape forming a continuous and closed contour of portion 110 of the semiconductor layer 106.

In this first embodiment, a portion 114 of the semiconductor layer 106 and a portion 115 of the sacrificial layer 104, which are adjacent to the trench 108, are intended to form an anchoring wall of the suspended membrane or membranes with the remainder of the device 100. These trenches 108, for example, may be produced by reactive ion etching (RIE).

Figure 4:
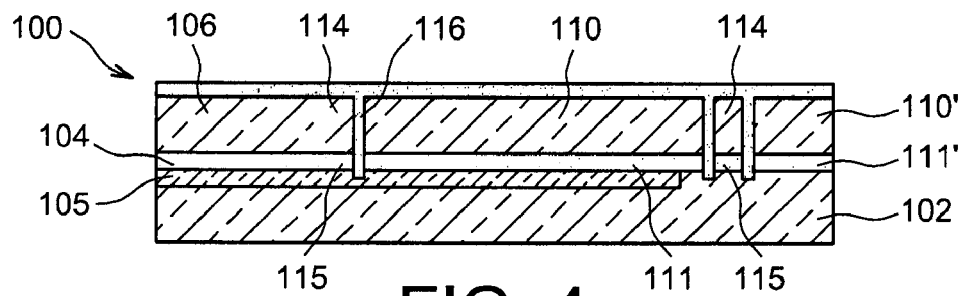

In FIG. 4, the trenches 108 and 108' are next filled with an etch stop material 116 resistant to one or more etching agents that will subsequently be used in the method for etching portion 111 of the sacrificial layer 104. This etch stop material, for example, is deposited via PECVD (plasma-enhanced chemical vapour deposition) or LPCVD (low pressure chemical vapour deposition). Since this subsequent etching is selective, the materials of the semiconductor layer 106, sacrificial layer 104 as well as the etch stop material 116 are chosen such that the etching agent etches the material of the sacrificial layer 104 without etching the etch stop material 116 deposited in the trenches 108, 108' or that of the semiconductor layer 106. In this first embodiment, the etch stop material 116 is deposited, for example, over a thickness equal to the width of the trench 108.

The table below provides examples of pairs of materials for the sacrificial layer 104 and etch stop materials 116 that can be used depending on the etching agent. The selectivity of an etching agent for a first material in relation to a second material is defined as the ratio of the etch rate of the first material in relation to that of a second material.

| Sacrificial layer 104 | Etching agent | Etch stop material 116 | Selectivity |
|---|---|---|---|
| SiO$_2$ | Concentrated HF, HF vapour, buffered HF | Si$_3$N$_4$ Si-rich SiN AlN Si | 1000 5000 500 infinite |
| Si, polySi | XeF$_2$ | SiO$_2$, Al, Ni, MgO, ZnO, Alumina, Glass, Ch | Greater than 1500 |
| Ti | Concentrated HF, HF vapour, buffered HF | Si$_3$N$_4$ Si-rich SiN AlN Si | Greater than 1500 |

In the embodiment described here, the etch stop material 116, for example, contains silicon-rich SiN. The silicon-rich SiN is non-stoichiometric silicon nitride obtained, for example, via LPCVD deposition (low pressure chemical vapour deposition). The silicon over-stoichiometry of this material is obtained by increasing the flow rate of dichlorosilane in relation to the flow rate of NH3 during production of the SiN. This nitride is also called "low-stress SiN".

Figure 5:
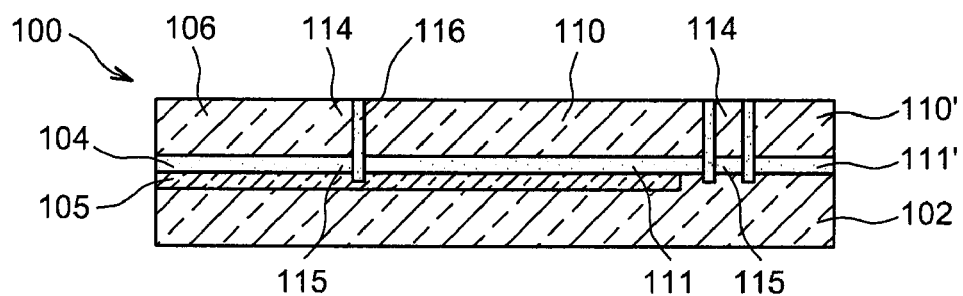

In FIG. 4, it is seen that the etch stop material 116 is likewise deposited on the semiconductor layer 106. As shown in FIG. 5, an etching is then made which enables elimination of the portions of the etch stop material 116 situated outside the trenches 108, 108', also referred to as levelling etch or lithography-free full cross-section etch. This etching, for example, is of the RIE-type (reactive ion etching).

Figure 6:
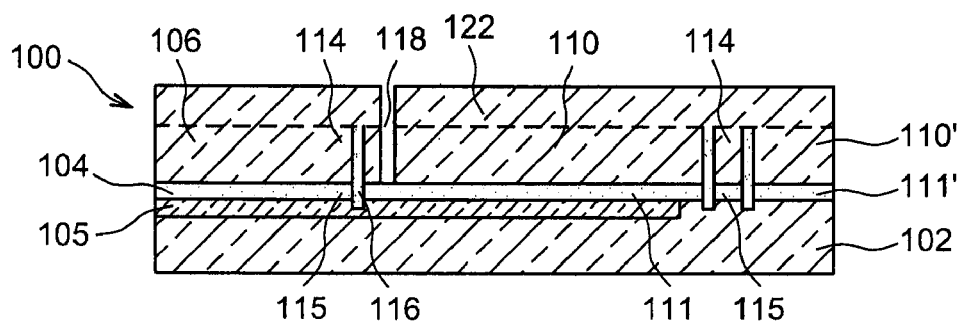

As can be seen in FIG. 6, for certain applications, it is possible to next carry out non-selective epitaxy, with respect to the etch stop material 116, on the semiconductor layer 106 and on the portions of the etch stop material 116 forming, for example, a layer 122 containing the same material as that of layer 106, e.g., monocrystalline or polycrystalline silicon, depending on the nature of the material on which epitaxy is carried out. In this way, the thickness of the semiconductor material initially formed by the semiconductor material 106 is increased, in order to obtain the thickness required for production of the suspended membrane of the device 100.

Thus, it is not necessary for the initial layer 106 to have the desired thickness for the suspended membrane that is produced. Increasing the thickness of material situated above the sacrificial layer 104 after ion implantation is carried out in the substrate 102 makes it possible, in particular, when the implantation is implemented, to have a thickness of materials compatible with the energy available for carrying out this implantation through the dielectric layer 104 and the semiconductor layer 106.

In an alternative, the thickening of the semiconductor layer 106 may be carried out by a transfer, e.g., obtained by gluing, possibly followed by a thinning out, of a substrate or film of material 122 transferred onto the semiconductor layer 106. Layer 122 may in particular be semiconductor-based, e.g., monocrystalline or non-monocrystalline silicon. In this way, at the end of the production process, it is possible to have a membrane which is entirely monocrystalline semiconductor-based, including the etch stop material portions 116, i.e., in proximity to the anchoring portions of the membrane, where mechanical stresses are the most significant when, for example, the membrane is being bent. The monocrystalline characteristic brings improved mechanical properties to the membrane in comparison with a polycrystalline semiconductor, which comprises a lower tensile strength than that of a monocrystalline semiconductor. Controlling the residual thickness of a layer that has been transferred onto the semiconductor layer 106 after being thinned out may be facilitated by the use of an SOI substrate the surface semiconductor layer of which (arranged on the oxide layer) is such that, after gluing and removal of the silicon lower layer and the oxide layer of the transferred SOI substrate, the total semiconductor thickness (thickness of the semiconductor layer 106+thickness of the surface semiconductor layer) is equal to the required thickness for the component being manufactured.

Regardless of the alternative chosen for obtaining the desired membrane thickness, at least one opening 118, in this case an access hole, is then etched through portion 110 of the semiconductor layer 106, as well as through layer 122. This opening 118, for example, is made by RIE etching. The cross-sectional dimensions of the opening 118 within the principal plane of layer 122 (e.g., the diameter or length of the sides) are, for example, between approximately 0.3 μm and a few micrometres, i.e., less than approximately 10 μm. This opening 118 makes it possible to access the part 111 of the sacrificial layer 104 encompassed by the etching stop material 116. This opening 118 may be made anywhere in portion 110 of the semiconductor layer 106, and preferably in proximity to the etch stop material 116, in order to avoid the centre of portion 110. It is likewise possible to make other openings through the epitaxially grown layer 122 and the semiconductor layer 106, so as to eliminate other portions of the sacrificial layer 104 than portion 111.

Figure 7:
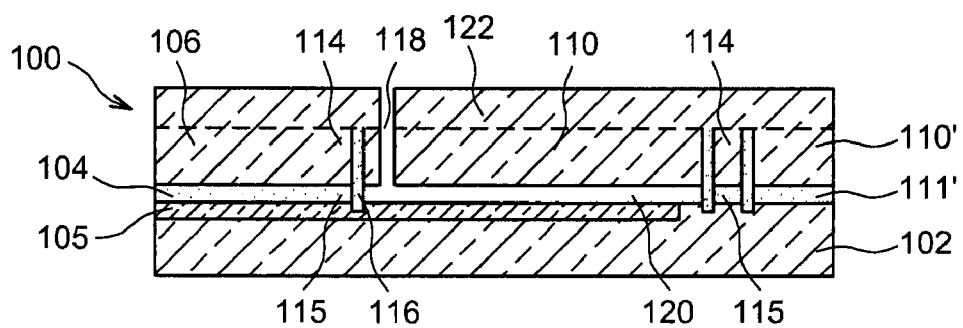

Finally, as shown in FIG. 7, portion 111 of the sacrificial layer 104, which is situated beneath portion 110 of the semiconductor layer 106, is then etched. After this etching, an empty space 120 or cavity is thus obtained, in place of portion 111 of the sacrificial layer 104. Etching thus ceases when the etching agent reaches the etch stop material 116. For example, a hydrogen fluoride-based aqueous solution may be used for this etching, which is diffused over portion 111 of the sacrificial layer 104, via opening 118.

In this way, portion 110 of the semiconductor layer 106 is released from the substrate 102, and is held to the device 100 by means of the epitaxially grown layer 122 on the remainder of semiconductor layer 106 and, in particular, by portions 114 forming anchoring regions. A suspended membrane device 100 is thereby obtained.

FIGS. 8 to 28 show the steps of a method for producing a suspended membrane device 200 according to a second embodiment. In this second embodiment, the device 200, for example, is a capacitive pressure sensor.

Figure 8:
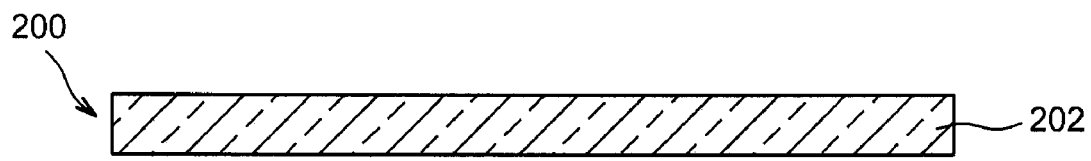
FIGS. 8 to 28 show the steps of a method for producing a suspended membrane device according to a second embodiment.

The device 200 is made from a semiconductor-based substrate 202, in this case silicon (FIG. 8).

Figure 9:
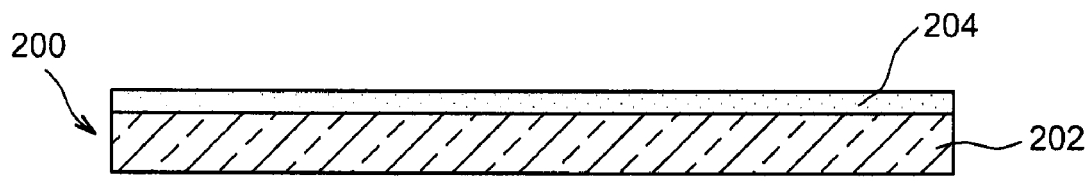

This substrate 202 is subjected to thermal oxidation, thereby forming thereupon a SiO$_2$-based layer 204. In the example of FIG. 9, the layer 204, for example, has a thickness equal to approximately 1 μm. Generally speaking, this layer 204 may have a thickness of between approximately 0.1 μm and 2 μm.

Figure 10:
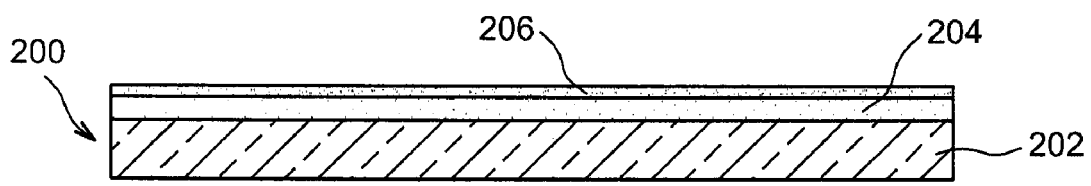

As shown in FIG. 10, a deposit, e.g., of the LPCVD or PECVD type, is then made on the oxide layer 204, of a layer 206 containing a material resistant to at least one etching agent that will be subsequently used during the course of the process. In FIG. 10, layer 206 contains "low-stress SiN," i.e., etch stop material 116 used in the first embodiment. The thickness chosen for layer 206 depends on the rate at which the material of layer 206 is etched by the etching agent and on the etching time. In the case of HF-type etching (using hydrogen fluoride), the function of layer 206 is likewise to protect the oxide layer 204. this layer 206, for example, has a thickness equal to approximately 0.3 μm, when the thickness of the material being etched is equal to 20 μm, for example.

Figure 11:
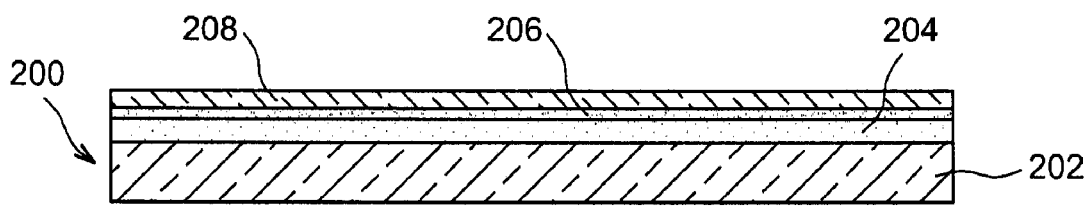

As shown in FIG. 11, layer 208 containing an electrically conductive material is then deposited, e.g., a polysilicon-based material. This deposit may be of the LPCVD type.

Layer 208 has thickness equal to approximately 0.35 μm, or more generally between approximately 0.1 μm and 1 μm. The material of this layer 208 is chosen so as to be resistant to an etching agent used subsequently in the method for producing the suspended membrane (see FIG. 24), and capable of withstanding the temperature of a sealing operation likewise carried out subsequently during the course of the method (see FIG. 15).

Figure 12:
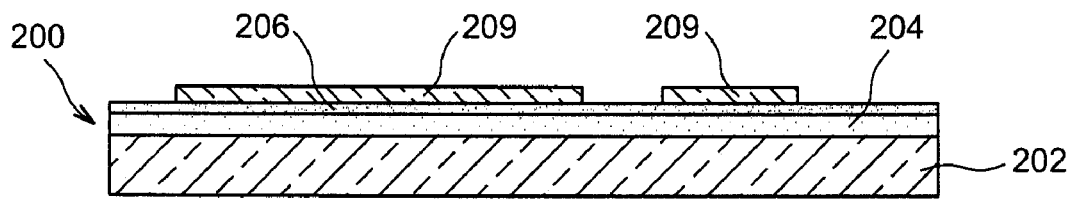

The electrically conductive layer 208 is then etched such that the remaining portions 209 of this electrically conductive layer 208 are intended to form lower electrodes of the device 200 capable of being used with the suspended membrane of the device 200 (see FIG. 12).

Figure 13:
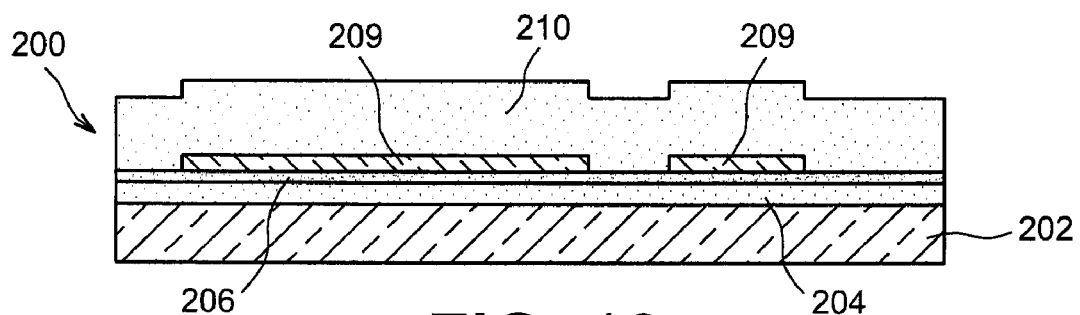
Figure 14:
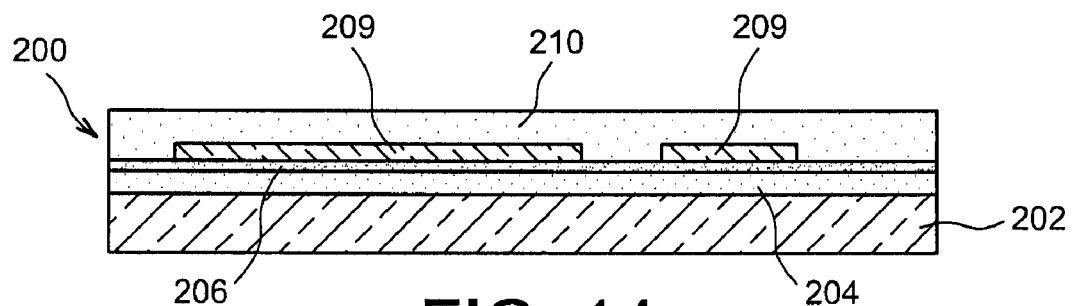
Figure 15:
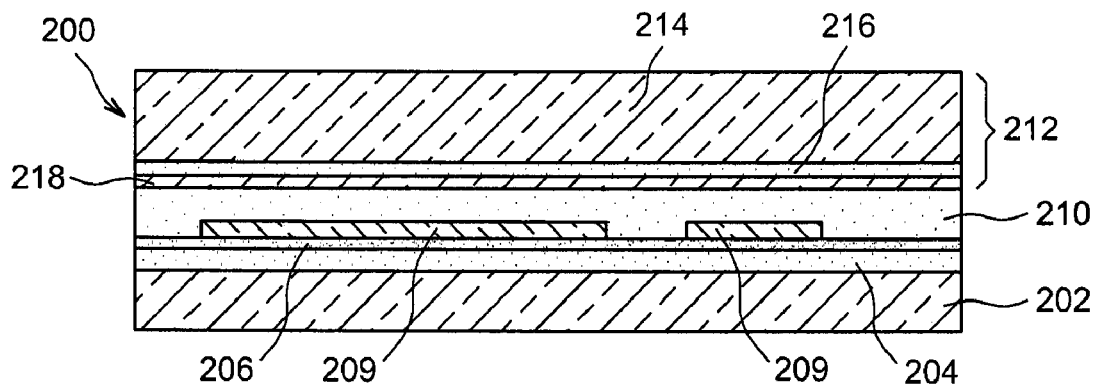

As shown in FIG. 13, a deposit is made of a layer 210 containing a material intended to be later etched by means of an etching agent, during the course of the method, and to thereby form a sacrificial layer 210. In this second embodiment, the sacrificial layer 210, for example, contains tetraethyl orthosilicate, also called TEOS oxide. The sacrificial layer 210 may also contain one or more of the materials usable for the sacrificial layer 104 cited in the first embodiment. This sacrificial layer 210 is then planarized (FIG. 14).

A transfer is then made, onto the sacrificial layer 210, of an 212 SOI substrate comprising a semiconductor-based substrate 214, e.g., silicon, an oxide layer 216 such as SiO$_2$ and a semiconductor layer 218, e.g., monocrystalline silicon. This transfer, for example, is carried out via molecular adhesion between the silicon layer 218 and the sacrificial layer 210.

Figure 16:
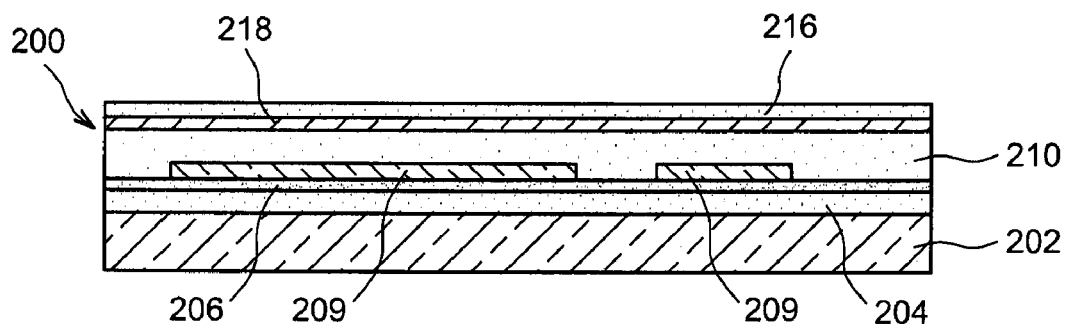
Figure 17:
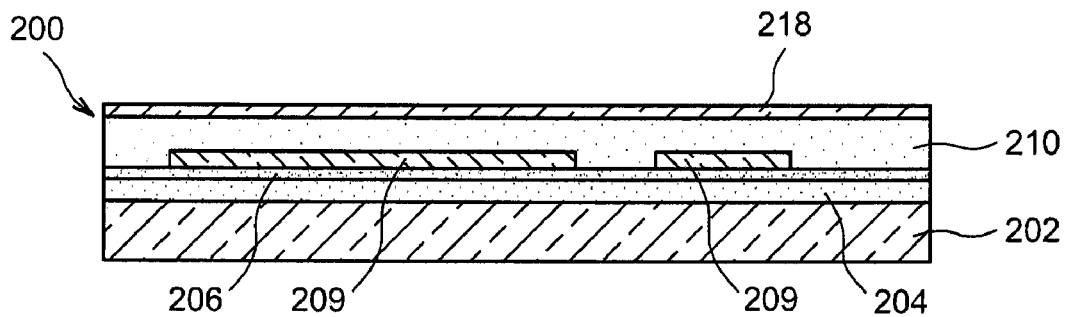

In FIG. 16, the transferred substrate 212 is then thinned out, stopping at the layer of SiO$_2$ 216, thereby eliminating the substrate 214. The layer of SiO$_2$ 216 is then eliminated by etching (FIG. 17).

Figure 18:
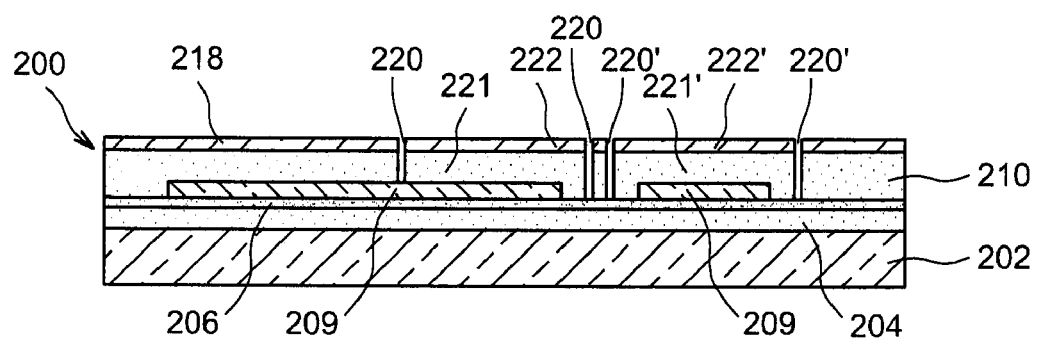

As in the first embodiment, a trench 220 is made through the silicon 218 as well as through the sacrificial layer 210 (FIG. 18). The trench 220 forms a closed contour, defining a portion 222 of the silicon layer 218 intended to form a suspended membrane of the device 200. Another trench 220' defining another portion 222' of the silicon layer 218 intended to form a second membrane is also shown.

Figure 19:
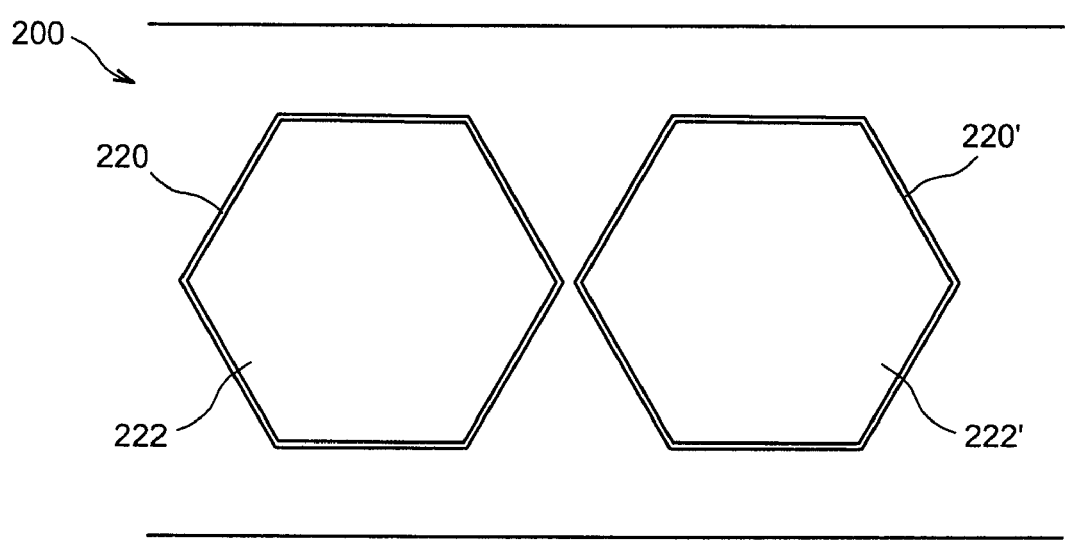

FIG. 19 shows a top view of the device 200 after the step of making trenches 220 and 220'. It is seen that portions 222 and 222' each have a hexagonal shape which is completely surrounded by trench 220 and 220', respectively. The production of several membranes, arranged side-by-side in hexagonal shape, in particular, enables a network of honeycomb-like membranes to be produced.

Figure 20:
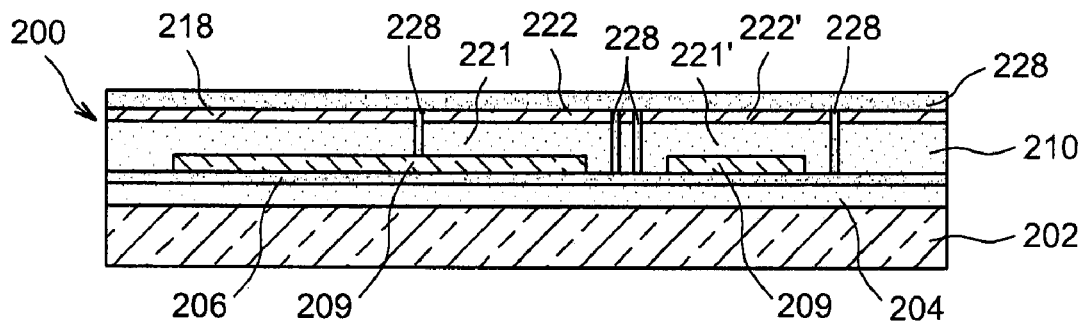
Figure 21:
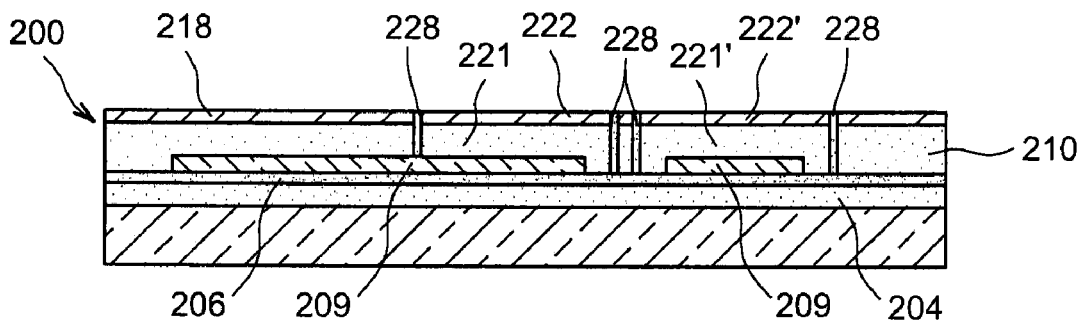

As in the first embodiment, an etch stop material 228 is then deposited on the silicon layer 218 and in the trenches 220, 220' (FIG. 20). In this second embodiment, the material 228 contains "low-stress SiN". The thickness of the layer of material 228 is, in this case, substantially equal to the width of the trenches 220, 220' made. A levelling etch is then carried out, thereby eliminating the material 228 not situated inside the trenches 220 and 220' (FIG. 21).

Figure 22:
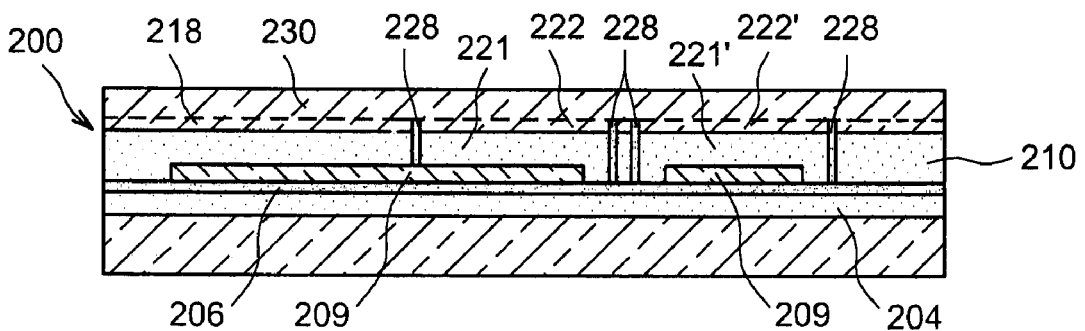

In a manner similar to the first embodiment, epitaxial growth of layer 218 is then carried out, forming a semiconductor-based layer 230, e.g., silicon, on this layer 218 and on the etch stop material portions 228 (FIG. 22). It is likewise possible to replace the epitaxy step with a step of molecular adhesion of a semiconductor layer (or substrate), and to then possibly thin out this layer or substrate.

Figure 23:
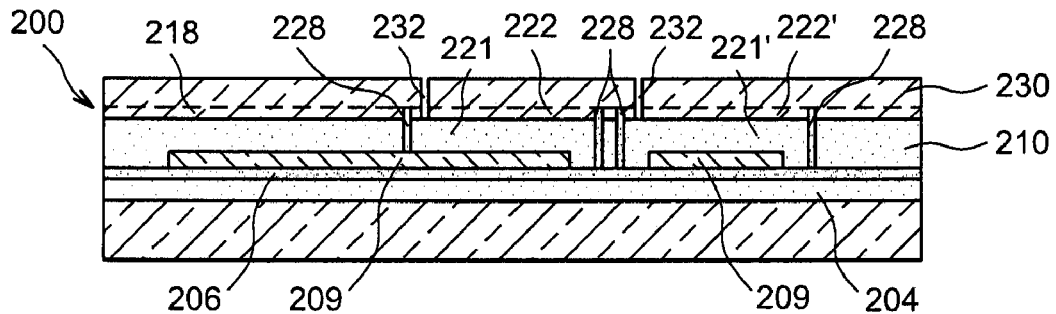

As shown in FIG. 23, openings 232 are then etched through portions 222, 222' of the silicon layer 218, as well as through the epitaxially grown layer 230. These openings 232 make it possible to access portions 221, 221' of the sacrificial layer 210 surrounded by the etch stop material 228.

Figure 24:
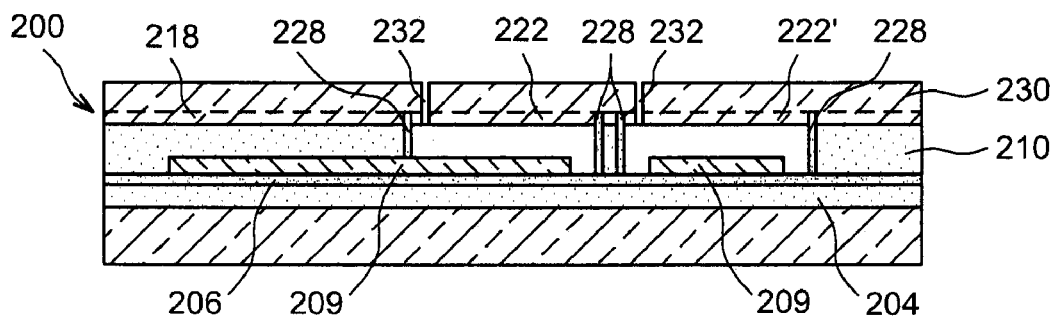

Portions 221, 221' of the sacrificial layer 210 surrounded by the etch stop material 228 are then etched with an HF-based aqueous solution. Empty spaces are thus obtained in place of portions 222, 222' of the sacrificial layer 210. Etching ceases when the etching agent reaches the etch stop material 228 (FIG. 24).

In this way, portions 222, 222' of the semiconductor layer 218 are partially released from the substrate 202, and held onto the device 200 by means of the epitaxially grown layer 230 on the remainder of the semiconductor layer 218 and, in particular, by the portions of the sacrificial layer 210 situated adjacent to the anchor area-forming trenches 228.

Figure 25:
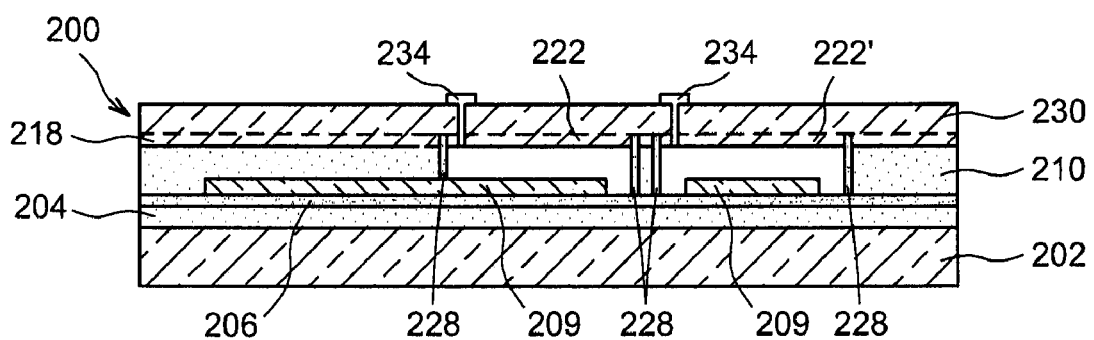
Figure 26:
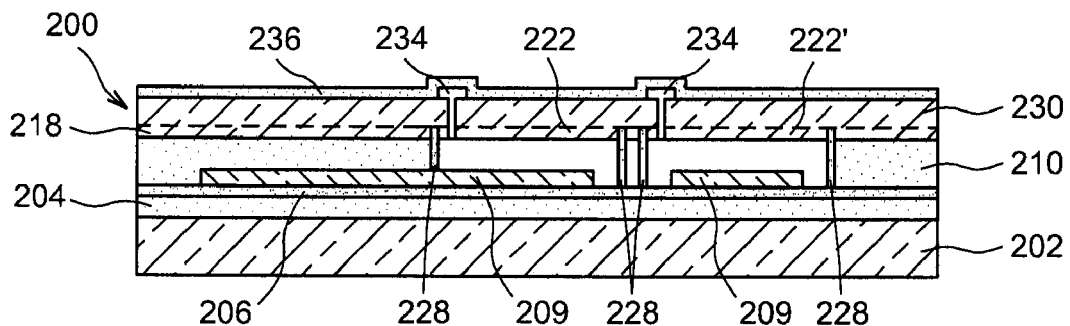

The openings 232 are then plugged, e.g., via deposition and etching of a material 234 such as phosphosilicate glass (PSG) (FIG. 25). As shown in FIG. 26, a passivation layer 236, e.g., containing a dielectric material, is then deposited on the device 200, i.e., on the epitaxially grown layer 230 and on the plugging material 234.

Figure 27:
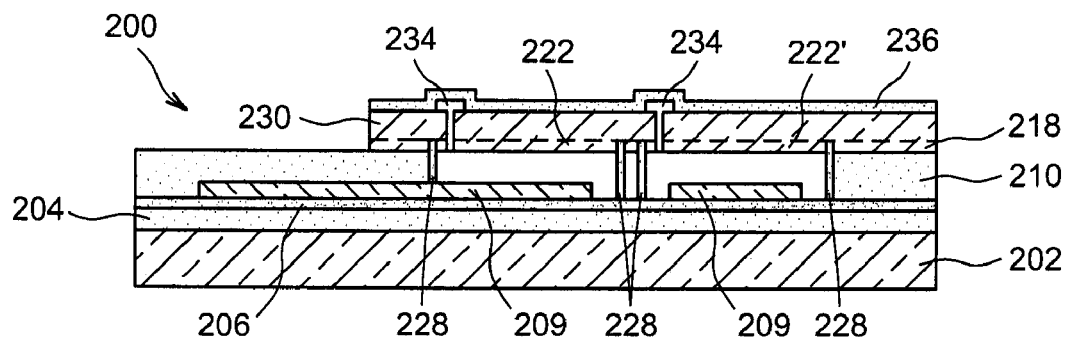
Figure 28:
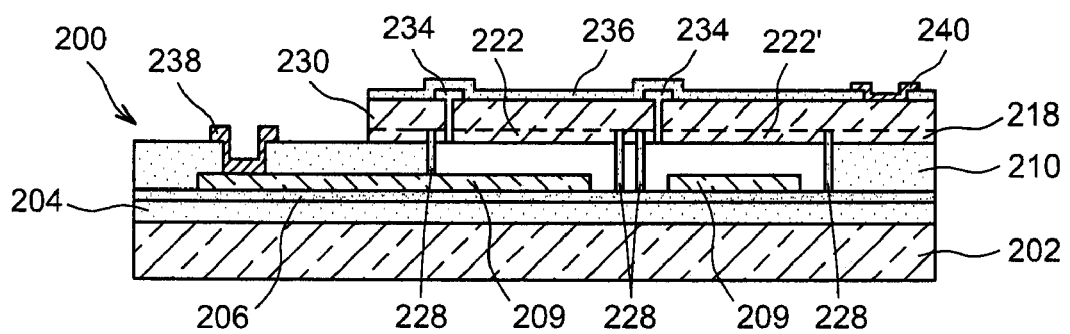

The portions of layers 218, 230 and 236 which are not intended to form part of the suspended membrane or of the remainder of the device 200 are then etched (FIG. 27). It is then possible to etch the sacrificial layer 210 so as to access the lower electrodes 209, and to carry out contact metallization 238 of a lower electrode 209. Metallization 240 likewise carried out through the passivation layer 236, in order to contact the epitaxially grown layer 230 (FIG. 28).

This second embodiment, in particular, enables a different electrical addressing of the electrodes 209, e.g., polycrystalline silicon-based. As a matter of fact, in the first embodiment, the PN junction formed by the lower implanted silicon electrodes and the substrate is blocked and calls upon an additional polarization of the substrate, which is not the case in this second embodiment. Furthermore, the device 200 according to the second embodiment can be used at a higher temperature that the previous described device 100, because the working temperature is not limited by PN junctions current leakages that may possible appear above 100° C.

When the suspended membrane of the device is not electrically insulated from the substrate or when one or more electrical connections are formed on this structure, the etch stop walls may be made of a conductive or semiconductor material. This case is described in connection with FIGS. 29 to 39, showing the steps of a method for producing a suspended membrane device 300 according to a third embodiment. In this third embodiment, the device 300 is a monocrystalline, piezoresistive-sensing membrane pressure sensor.

Figure 29:
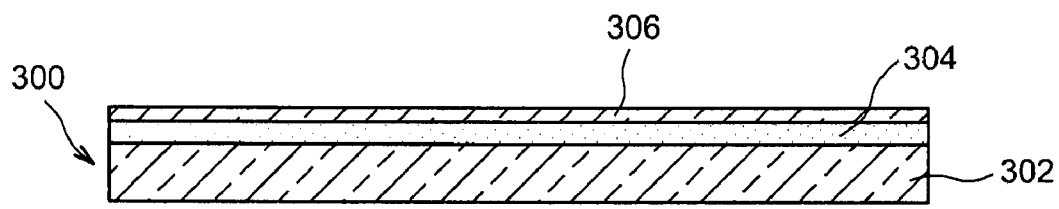
FIGS. 29 to 39 show the steps of a method for producing a suspended membrane device according to a third embodiment.
Figure 30:
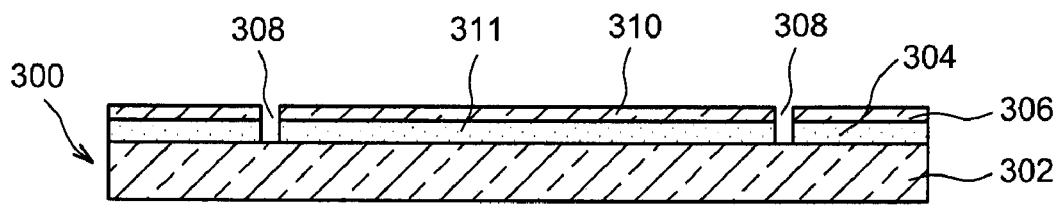

Starting with an SOI substrate comprising a substrate 302, a dielectric layer 304 and a semiconductor-based layer 306, in this case monocrystalline silicon, e.g., similar to the SOI substrate described in connection with FIG. 1, and shown in FIG. 29, a trench 308 is etched in the semiconductor layer 306 and dielectric layer 304, which is a sacrificial layer (FIG. 30). The trench 308 is made along a continuous line, completely surrounding and defining a first portion 310 of the semiconductor layer 306 intended to form a suspended membrane of the device 300, as well as a first portion 311 of the sacrificial layer 304 likewise surrounded by the trench 308. This trench 308 is made over a width of between approximately 1 μm and 2 μm, e.g., via reactive ion etching.

Figure 31:
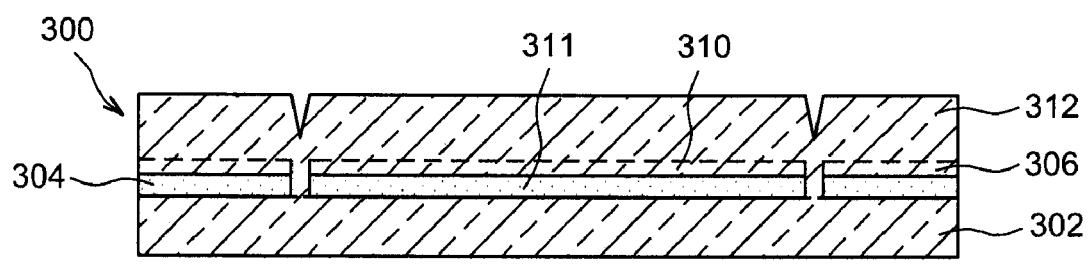

As shown in FIG. 31, it is possible to carry out non-selective epitaxy on the material of the sacrificial layer 304, thereby form an upper layer of silicon 312 on layer 306, the thickness of which corresponds to that desired for the production of a suspended membrane. Furthermore, the trench 308 is also filled with the epitaxially grown material 312.

Figure 32:
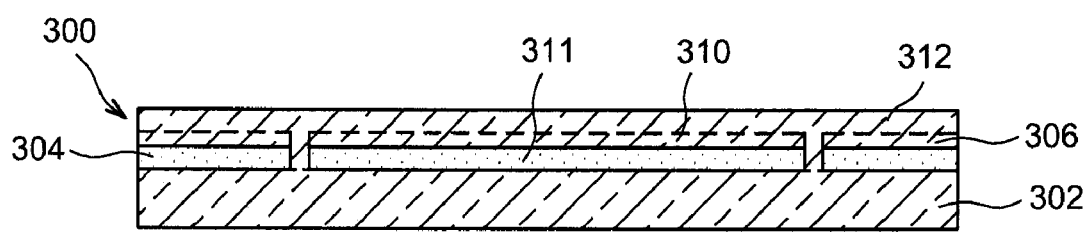

Mecanochemical planarization of the epitaxially grown layer 312 is then carried out in order to obtain the desired silicon thickness for the suspended membrane (FIG. 32).

Figure 33:
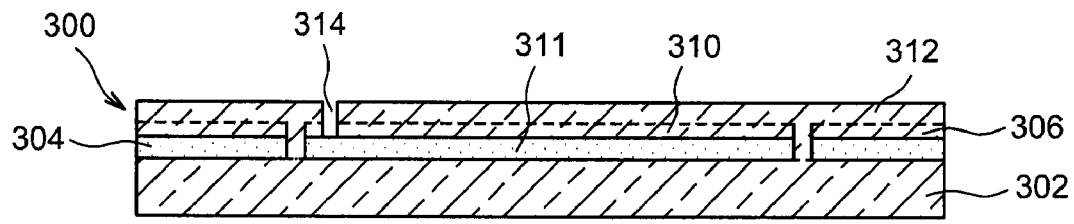

As in the preceding embodiments, an opening 314 is etched in the epitaxially grown layer 312 and the first portion 310 of the semiconductor layer 306, thereby enabling access to the first portion 311 of the sacrificial layer 304 (FIG. 33).

Figure 34:
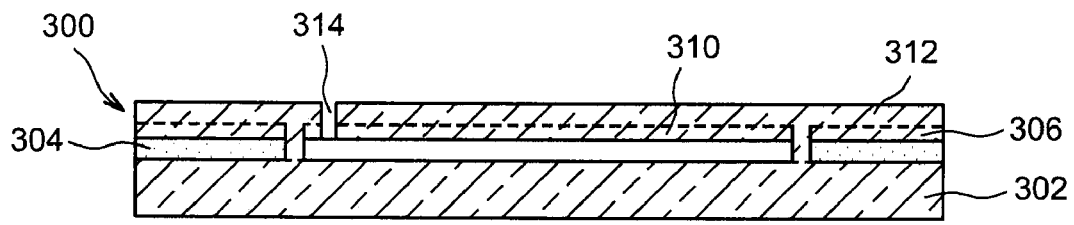

As shown in FIG. 34, the portion 311 of the sacrificial layer 304 defined by the trench 308 is then etched. In this third embodiment, it is the epitaxially grown material 312, in this case silicon, which forms the etch stop material. This etching may be carried out with an HF-based aqueous solution.

Figure 35:
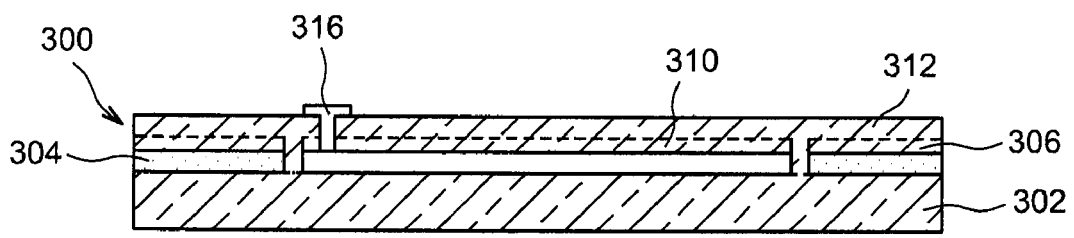

As in the second embodiment, the opening 314 is plugged by depositing and etching a material 316 such as phosphosilicate glass (PSG) (FIG. 35). Creep may then be produced by PSG annealing at a temperature greater than 1000° C.

Figure 36:
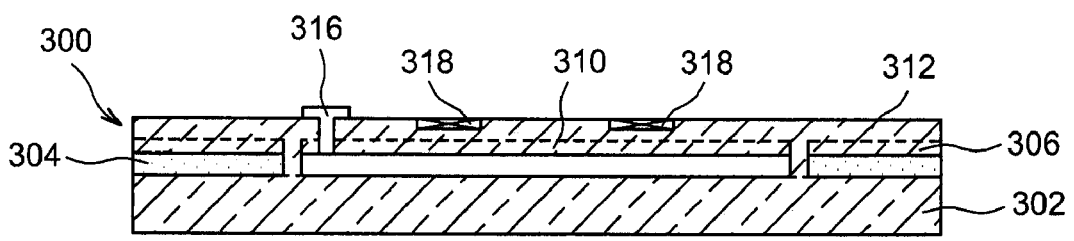
Figure 37:
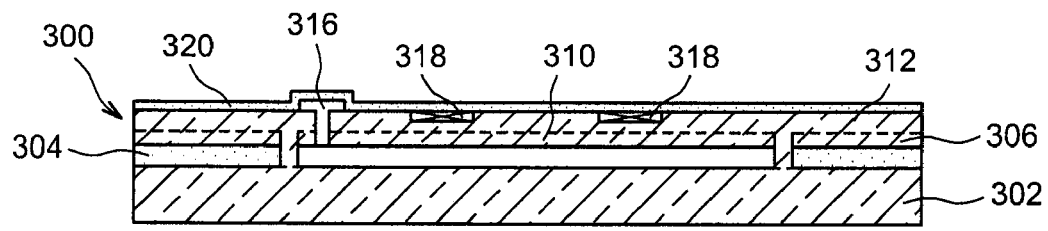

Ion implantation is then carried out, forming piezoelectric gauges 318 in the epitaxially grown layer 312 (FIG. 36). The device 300 is then passivated by depositing a passivation layer 320 (FIG. 37).

Figure 38:
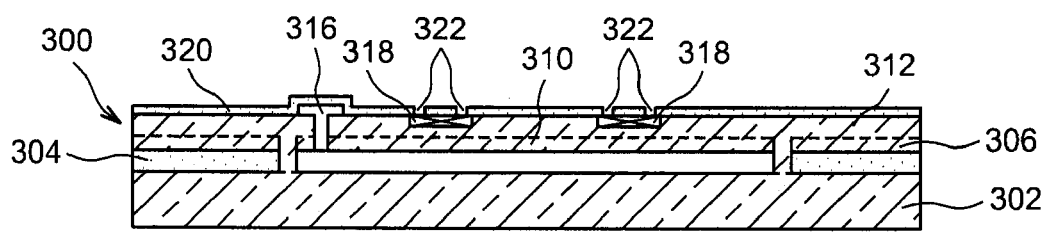

Contact holes 322 are then made in the passivation layer 320, in the vicinity of the gauges 318 (FIG. 38).

Figure 39:
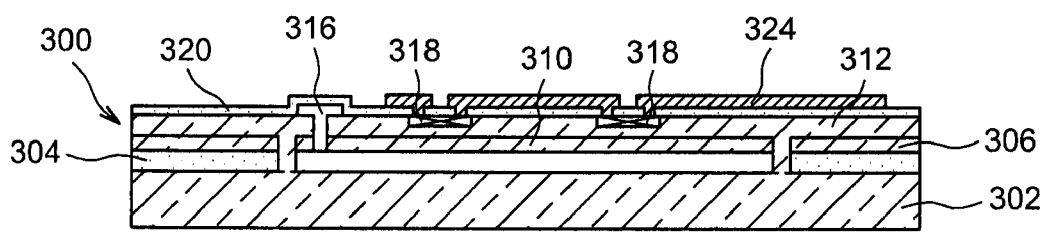

The device 300 is then completed by making metal interconnecting tracks 324, as shown in FIG. 39, which come into contact with the gauges 318.

In the three embodiments described, each trench defining a portion of the semiconductor layer intended to form a suspended membrane of the device is entirely filled with the etch stop material intended for stopping the etching of a sacrificial material. In an alternative of these three embodiments, the trench may first be partially filled with a first material forming a layer, e.g., having a substantially uniform thickness, on the inside walls of the trench, and by then depositing in the space remaining inside the trench, over the etch stop material, a second material, e.g., obtained via epitaxy and capable of forming a portion of the suspended membrane. The first material, for example, may be a dielectric such as $SiO_2$ and/or SiN, the second epitaxially grown material possibly being silicon. In this case, in particular, the principal function of the $SiO_2$ layer is to electrically insulate the substrate from the epitaxially grown layer. It must be sufficiently resistant to the etching agent of the sacrificial layer, however the etch stop function is fulfilled by the epitaxially grown silicon present in the trench.

In the previously described examples, the deposits of materials inside the trenches are carried out on the "vertical" walls of the trenches, and not from the bottom of the trenches. Since the rate of deposition on these "vertical" walls is lower than that on the "horizontal" surfaces, e.g., the bottom wall of the trenches, the thickness to be deposited in order to fill a trench is generally equal to the width of the trench. The width of the trenches is thus chosen to be compatible with the maximum thickness of the etch stop material capable of being deposited in the trenches.

When the trenches have a width greater than the maximum thickness of the etch stop material capable of being deposited in the trenches, the trenches may be filled via a first deposit of an etch stop material, and then by at least a second deposit of another material in the trenches. When the material resistant to said etching agent arranged inside the trench is electrically conductive, the trench may be filled via a first deposit of a dielectric material and via a second deposit of said material resistant to said etching agent.

FIGS. 40 to 47 show the steps of an example of such filling of the trenches of a suspended membrane device 400. This filling example may, in particular, be implemented during the course of one of the methods of producing previously described suspended membrane devices.

Figure 40:
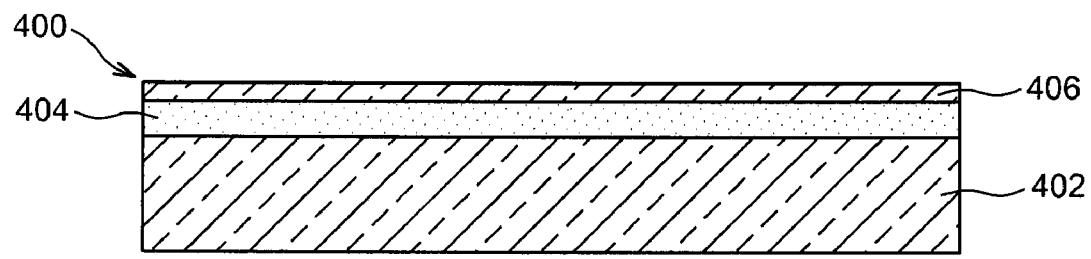
FIGS. 40 to 47 show the steps of a first trench-filling example implemented during a method for producing a suspended membrane device.

As shown in FIG. 40, the device 400 is made from a substrate 402 containing at least one semiconductor, e.g., silicon, upon which are stacked a dielectric layer 404, e.g., containing $SiO_2$ and forming a sacrificial layer, and a thin, semiconductor-based layer 406, e.g., silicon.

Figure 41:
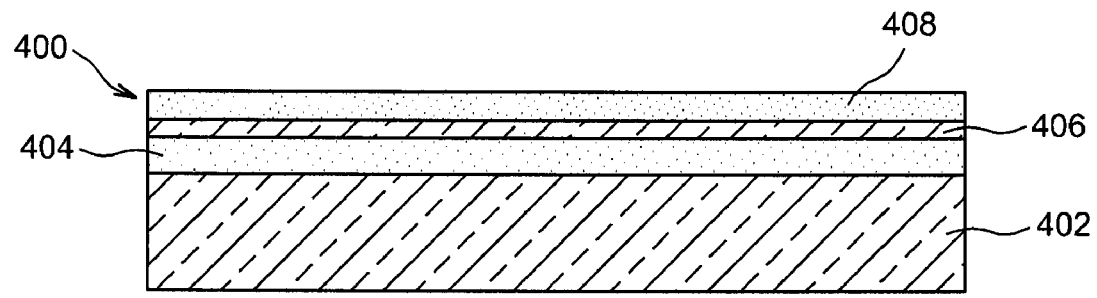

A dielectric layer 408, e.g., containing $SiO_2$, is deposited on a thin silicon layer 406 (FIG. 41).

Figure 42:
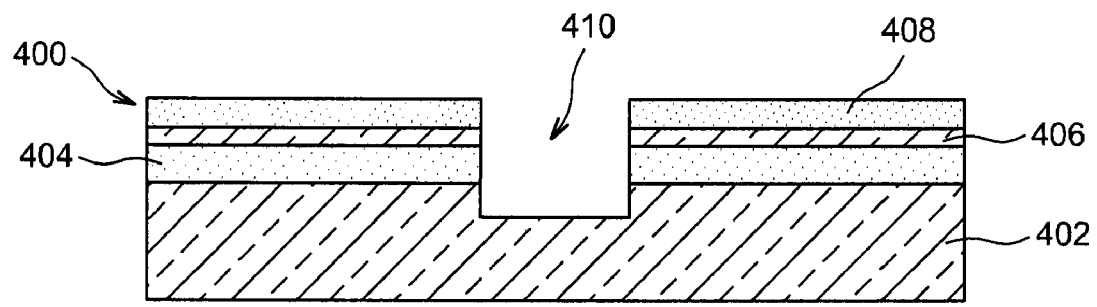

A trench 410 is then etched through layers 408, 406, 404, and also partially in the substrate 402 (FIG. 42). As in the previously described methods of producing a suspended membrane device, the trench 410 forms a continuous line completely surrounding and defining a portion of the thin layer 406 intended to form at least a portion of a suspended membrane of the device 400.

Figure 43:
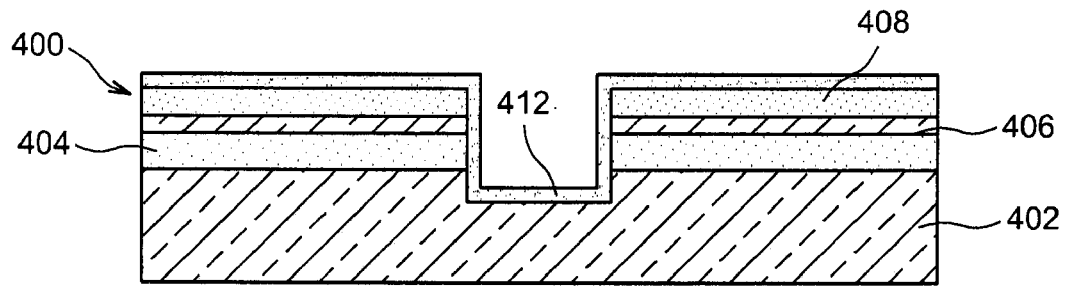
Figure 44:
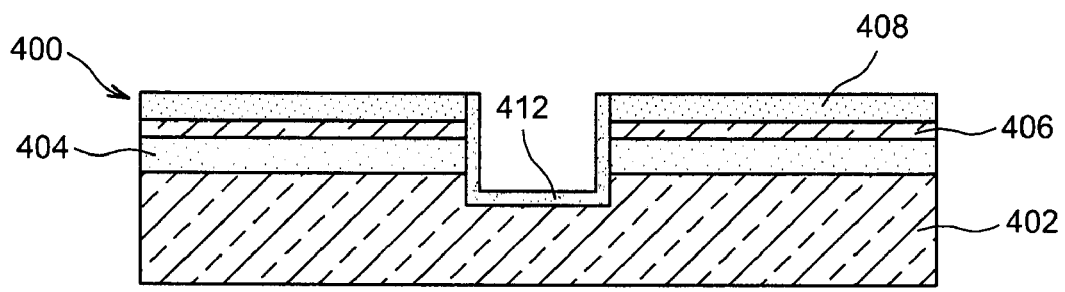
Figure 45:
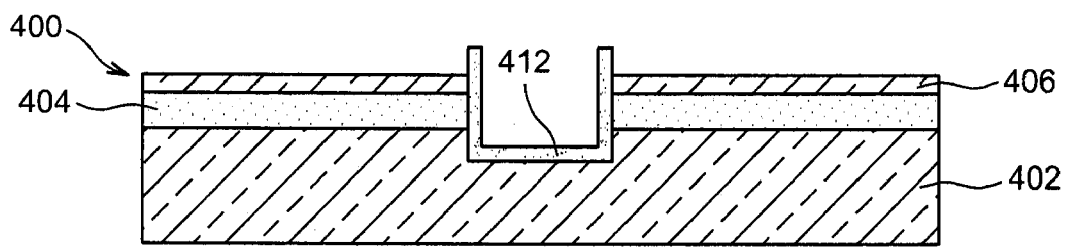

As shown in FIG. 43, an etch resistant material-based layer 412, e.g., a dielectric, is deposited in the trench 410 and on the dielectric layer 408. Polishing then enables elimination of the portions of this layer 412 situated on the dielectric layer 408 (FIG. 44). The dielectric layer 408 is then eliminated by etching, for example (FIG. 45).

Figure 46:
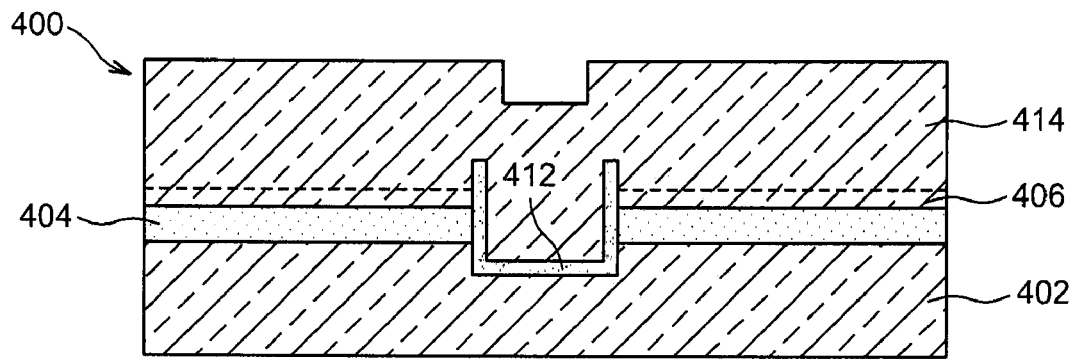

As shown in FIG. 46, epitaxial growth is then carried out on the thin layer 406, thereby forming a layer 414 containing the thin-layer material 406, i.e., polycrystalline or monocrystalline, in the vicinity of the thin layer 406. Epitaxy is likewise carried out in the trench 410, i.e., on the etch-resistant material 412.

Figure 47:
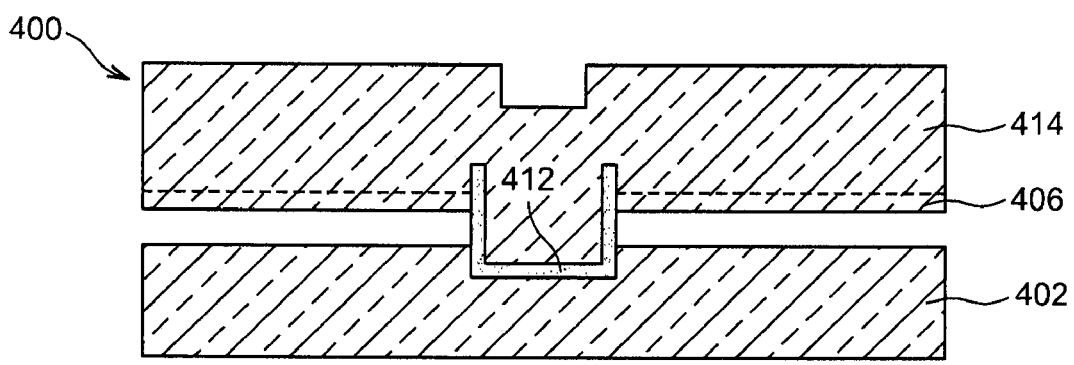

Finally, the dielectric material 404 is etched, e.g., via HF etching. The presence of the material 412 makes it possible to preserve the epitaxially grown material 414 previously produced inside the trench 410, thereby forming an attachment to the substrate 402 (FIG. 47).

Figure 48:
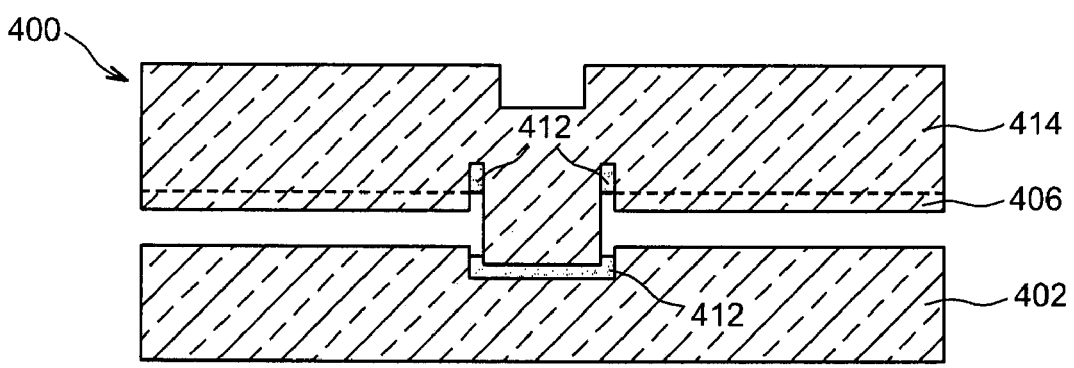
FIG. 48 shows a device obtained via an alternative of the first trench-filling example implemented during a method for producing a suspended membrane device.

In an alternative, material 412 may not be resistant to the etching agent used for etching the dielectric layer 404, and may, for example, consist of an ordinary dielectric material. This material, in particular, makes it possible to ensure electrical insulation between the substrate and the epitaxially grown layer 414, with respect to the anchoring produced. In this case, the portions of layer 414 situated near the dielectric layer 404 are then etched during etching of the dielectric layer 404, as shown in FIG. 48, etching being stopped by the epitaxially grown silicon of layer 414, in the previously formed trench 410.

Another example of filling the trench of the suspended membrane device 400 will now be described in connection with FIGS. 49 to 54, showing a portion of the steps of such a filling operation.

The steps previously described in connection with FIGS. 40 to 43 will be carried out first.

Figure 49:
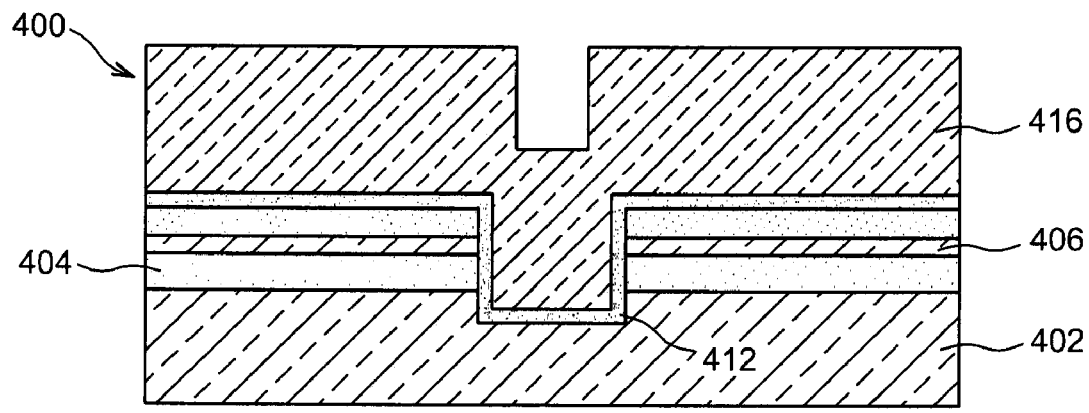
FIGS. 49 to 53 show a portion of the steps of a second trench-filling example implemented during a method for producing a suspended membrane device.

As shown in FIG. 49, a thick deposit of polycrystalline silicon 416 is made on the dielectric layer 412, in the vicinity of the trench 410 and in the vicinity of the thin layer 406. A thick deposit is understood to mean the deposit of a layer the thickness of which is at least equal to the depth of the trench 410.

Figure 50:
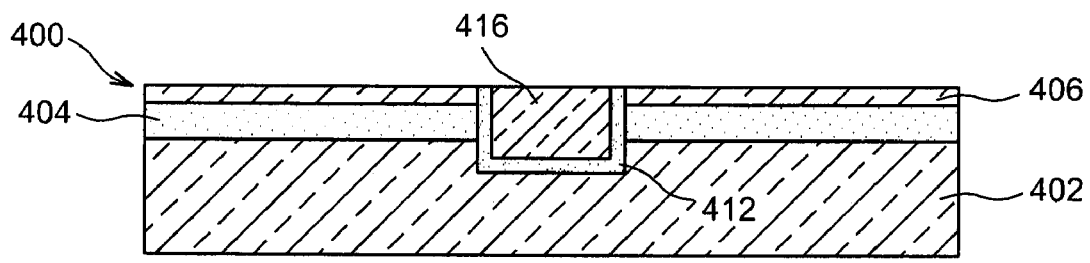

Planarization is then carried out, stopping at the thin layer 406 (FIG. 50). In this way, only the portion of the layer 416 situated inside the trench 410 is still present. This planarization also eliminates the dielectric layer 408 as well as the portions of the dielectric layer 412 situated inside the trench 410.

Figure 51:
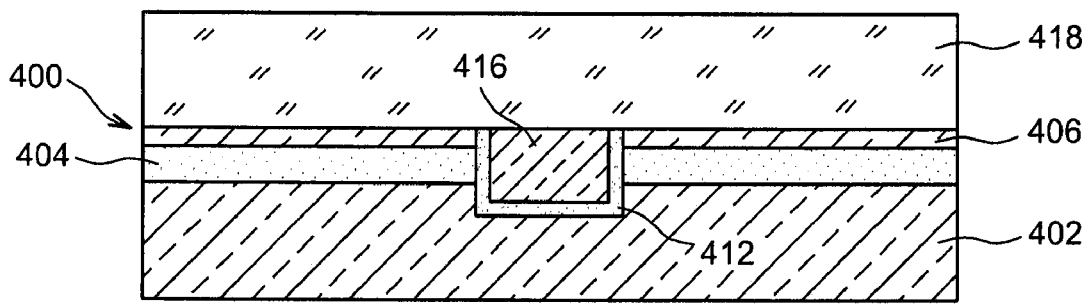
Figure 52:
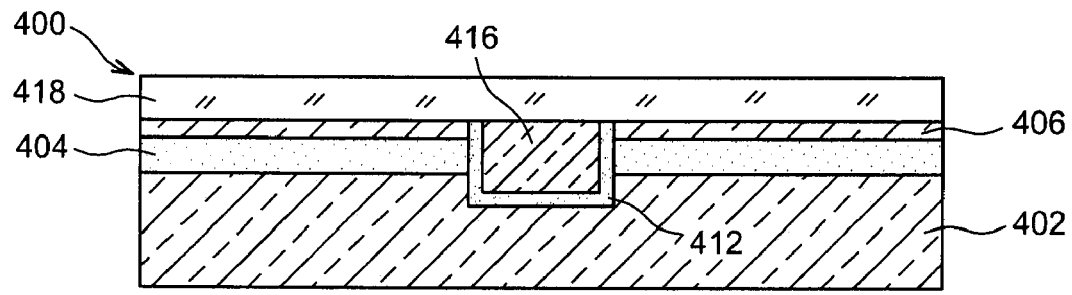

As shown in FIG. 51, a substrate 418, in this case monocrystalline silicon-based, is adhesion-transferred onto the device 400, i.e., onto the thin layer 406 and onto the remaining portions of layers 412 and 416. This substrate 418 is then thinned out according to the desired thickness for the suspended membrane of the device 400 (FIG. 52).

Figure 53:
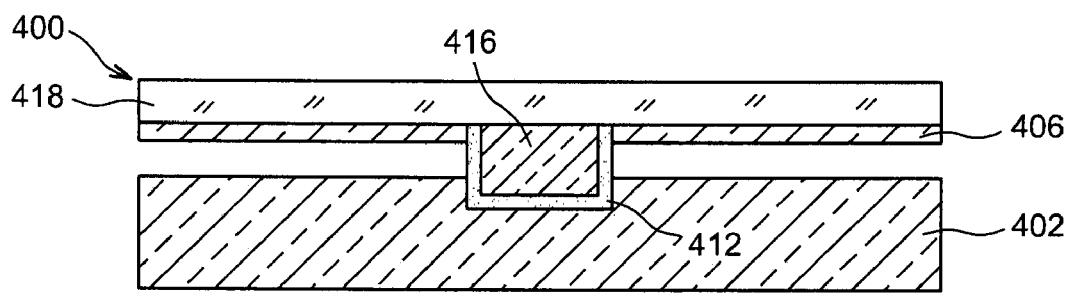

Finally, the dielectric layer 404 is etched, thereby releasing the suspended membrane and forming an anchoring thereof to the substrate 402, owing to the remaining portions of layers 412 and 416 (FIG. 53).

Figure 54:
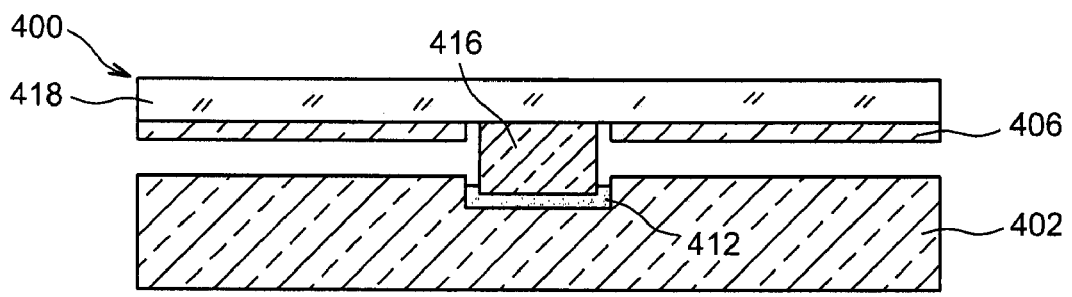
FIG. 54 shows a device obtained via an alternative of the second trench-filling example implemented during a method for producing a suspended membrane device.

As for the preceding trench-filling example, it is possible for layer 412 to contain a material which is not resistant to the etching agent used to eliminate the dielectric layer 404, but, for example, to consist of an ordinary dielectric material. In this case, as shown in FIG. 54, the portions of the dielectric layer 412 exposed to the etching agent used to eliminate the dielectric layer 404 are also etched, material 416 then acting as an etch stop material. In this case, material 416 thus provides an electrical insulation function between the anchoring material 416 and the substrate 402.

The invention claimed is:

1. A method for producing a device with at least one suspended membrane, comprising at least the following steps:
   producing a trench through a first sacrificial layer and a second layer deposited on the first sacrificial layer, the trench completely surrounding at least a portion of the first sacrificial layer and at least a portion of the second layer,
   filling all or a portion of the trench with at least one material capable of resisting at least one etching agent,
   etching said portion of the first sacrificial layer with said etching agent through at least one opening made in the second layer,
   said portion of the second layer forming at least one portion of the suspended membrane, and
   between the step of filling the trench and the step of etching said portion of the first sacrificial layer, a step of non-selective epitaxy on the second layer and on the material deposited in the trench or a step of transferring a material onto the second layer and onto the material arranged inside the trench, wherein the transferred material or epitaxial material is at least partially monocrystalline.

2. The method according to claim 1, the second layer comprising at least one semiconductor material at least a portion of which is mono crystalline.

3. The method according to claim 1, further comprising, prior to the trench-producing step, a step of producing at least one electrode beneath said portions of the first sacrificial layer and second layer, via ion implantation in a third layer, the first sacrificial layer and the second layer being deposited on this third layer.

4. The method according to claim 1, further comprising, prior to the trench production step, a step of producing at least one electrode via at least one deposit of an electrically conductive material capable of resisting at least said etching agent, on a third layer containing a material capable of resisting at least said etching agent, the first sacrificial layer and second layer being deposited on the third layer, said portion of the first sacrificial layer being deposited over at least a portion of the electrode.

5. The method according to claim 1, filling of the trench being obtained via a step of non-selective epitaxial growth on the second layer and inside the trench.

6. The method according to claim 1, further comprising, after the etching step, a step of depositing a passivation layer onto the device.

7. The method according to claim 1, further comprising, after the etching step, a step for producing contacts electrically connected to said portion of the second layer, and/or to the electrode when the method comprises a step for producing an electrode.

8. The method according to claim 1, the material arranged inside the trench being a dielectric material.

9. The method according to claim 1, the trench being filled by at least a first deposit of the material resistant to said etching agent and by a second deposit of another material inside the trench.

10. The method according to claim 1, the trench being filled by a first deposit of a dielectric material and by a second deposit of the material resistant to said etching agent.

11. The method according to claim 1, wherein the at least one opening made in the second layer is made in said portion of the second layer.

* * * * *

UNITED STATES PATENT AND TRADEMARK OFFICE
CERTIFICATE OF CORRECTION

| | | |
|---|---|---|
| PATENT NO. | : 8,163,586 B2 | Page 1 of 1 |
| APPLICATION NO. | : 12/265256 | |
| DATED | : April 24, 2012 | |
| INVENTOR(S) | : Rey et al. | |

It is certified that error appears in the above-identified patent and that said Letters Patent is hereby corrected as shown below:

In Column 12, Claim 2, line 42, please delete "mono crystalline" and insert therefor --monocrystalline--.

Signed and Sealed this
Thirty-first Day of July, 2012

David J. Kappos
*Director of the United States Patent and Trademark Office*